US010060226B2

(12) United States Patent
Dusterhoft et al.

(10) Patent No.: US 10,060,226 B2
(45) Date of Patent: Aug. 28, 2018

(54) WELL PLACEMENT AND FRACTURE DESIGN OPTIMIZATION SYSTEM, METHOD AND COMPUTER PROGRAM PRODUCT

(75) Inventors: Ronald Glen Dusterhoft, Katy, TX (US); Marty Paulk, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 592 days.

(21) Appl. No.: 14/426,231

(22) PCT Filed: Sep. 7, 2012

(86) PCT No.: PCT/US2012/054266
§ 371 (c)(1),
(2), (4) Date: Mar. 5, 2015

(87) PCT Pub. No.: WO2014/039052
PCT Pub. Date: Mar. 13, 2014

(65) Prior Publication Data
US 2015/0233214 A1 Aug. 20, 2015

(51) Int. Cl.
| | | |
|---|---|---|
| *G06F 17/50* | (2006.01) | |
| *E21B 41/00* | (2006.01) | |
| *G01V 99/00* | (2009.01) | |
| *E21B 43/26* | (2006.01) | |
| *E21B 43/30* | (2006.01) | |

(52) U.S. Cl.
CPC ........ *E21B 41/0092* (2013.01); *G01V 99/005* (2013.01); *E21B 43/26* (2013.01); *E21B 43/305* (2013.01); *G06F 17/5009* (2013.01)

(58) Field of Classification Search
USPC ....... 703/2, 10; 702/6; 166/268, 298; 367/68
See application file for complete search history.

(56) References Cited

U.S. PATENT DOCUMENTS

| | | | |
|---|---|---|---|
| 5,311,951 A | 5/1994 | Kyte et al. | |
| 5,441,110 A | 8/1995 | Scott, III | |
| 7,953,587 B2* | 5/2011 | Bratton .................. | E21B 41/00 703/10 |
| 8,154,950 B2* | 4/2012 | Heliot .................... | G01V 11/00 367/68 |
| 8,645,571 B2* | 2/2014 | Downton ................ | E21B 47/12 340/853.3 |
| 9,026,420 B2* | 5/2015 | Gorell .................... | G01V 99/00 703/10 |
| 2007/0294034 A1* | 12/2007 | Bratton .................. | E21B 41/00 702/6 |
| 2008/0164030 A1* | 7/2008 | Young ................... | E21B 43/263 166/299 |

(Continued)

FOREIGN PATENT DOCUMENTS

WO  WO-2010115211 A1  10/2010

OTHER PUBLICATIONS

European Patent Office, Supplementary European Search Report, dated May 10, 2016, 7 pages, Europe.

(Continued)

*Primary Examiner* — Thai Phan (57) ABSTRACT

A well design system that utilizes geological characteristics and fracture growth behavior along of a vertical stratigraphic column of the formation in order to optimize well placement and fracture stimulation designs for the entire formation.

30 Claims, 8 Drawing Sheets

(56) References Cited

U.S. PATENT DOCUMENTS

| | | | |
|---|---|---|---|
| 2009/0125280 A1 | 5/2009 | Soliman et al. | |
| 2010/0149918 A1* | 6/2010 | Heliot | G01V 11/00 367/68 |
| 2010/0204972 A1* | 8/2010 | Hsu | E21B 49/006 703/10 |
| 2010/0307742 A1 | 12/2010 | Phillips et al. | |
| 2010/0312529 A1 | 12/2010 | Souche et al. | |
| 2013/0199781 A1* | 8/2013 | Dale | E21B 43/26 166/268 |
| 2013/0206412 A1* | 8/2013 | Dale | E21B 43/30 166/298 |
| 2013/0211807 A1* | 8/2013 | Templeton-Barrett | E21B 43/26 703/10 |
| 2015/0267525 A1* | 9/2015 | May | E21B 44/005 700/275 |
| 2017/0074998 A1* | 3/2017 | McColpin | G01V 1/40 |
| 2017/0074999 A1* | 3/2017 | Walters | G01V 1/30 |
| 2017/0075003 A1* | 3/2017 | Dusterhoft | G01V 1/303 |
| 2017/0075004 A1* | 3/2017 | McColpin | G01V 1/303 |

OTHER PUBLICATIONS

Anwar Husen Akbar Ali, Tim Brown, Roger Delgado, Don Lee, Dick Plumb, Nikolay Smirnov, Rob Marsden, Erling Prado-Velarde, Lee Ramsey, Dave Spooner, Terry Stone and Tim Stouffer, Watching Rocks Change—Mechanical Earth Modeling, Summer 2003, 22-39, Oilfield Review.

International Search Report and Written Opinion, Dec. 4, 2012, 7 pages, International Search Authority United States.

* cited by examiner

WELL PLACEMENT AND FRACTURE DESIGN OPTIMIZATION SYSTEM, METHOD AND COMPUTER PROGRAM PRODUCT

The present application is a U.S. National Stage patent application of International Patent Application No. PCT/US2012/054266, filed on Sep. 7, 2012, the benefit of which is claimed and the disclosure of which is incorporated herein by reference in its entirety.

FIELD OF THE INVENTION

The present invention relates generally to hydrocarbon reservoir modeling and, more specifically, to a system which optimizes well placement and fracture stimulation design for wells in layered reservoirs.

BACKGROUND

At the present time, horizontal wells and hydraulic fracturing are the typical approaches utilized to exploit natural gas, condensate and oil from low quality shale reservoirs. Shale reservoirs include a wide range of rock types, with most being unproductive. Nevertheless, the industry has viewed these shale assets as resource plays and approached treatment under the assumption that they are homogeneous reservoirs. As such, "cookie cutter" well designs having uniform well and fracture spacing are traditionally adopted for well construction and fracture treatments.

Although efficient, there is at least one drawback to the conventional approach. In reality, the shale reservoirs are highly laminated and heterogeneous, having extreme variation in reservoir properties along the vertical direction. For example, due to variation in mechanical properties and stresses over the vertical strata, hydraulic fracture growth behavior will change significantly depending on the exact fracture initiation points and the properties around the initiation points. In some places, fracture height growth may be significant, while in other locations fracture height growth may be severely restricted. Therefore, the current approach of using the same treatment for each stage in each well can be very ineffective.

In view of the foregoing, there is a need in the art for a cost-effective wellbore optimization technique which considers the heterogeneous properties of the reservoir in determining well placement and fracture design.

DESCRIPTION OF ILLUSTRATIVE EMBODIMENTS

Illustrative embodiments and related methodologies of the present invention are described below as they might be employed in a system to optimize well placement and fracture design. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the invention will become apparent from consideration of the following description and drawings.

Figure 1:
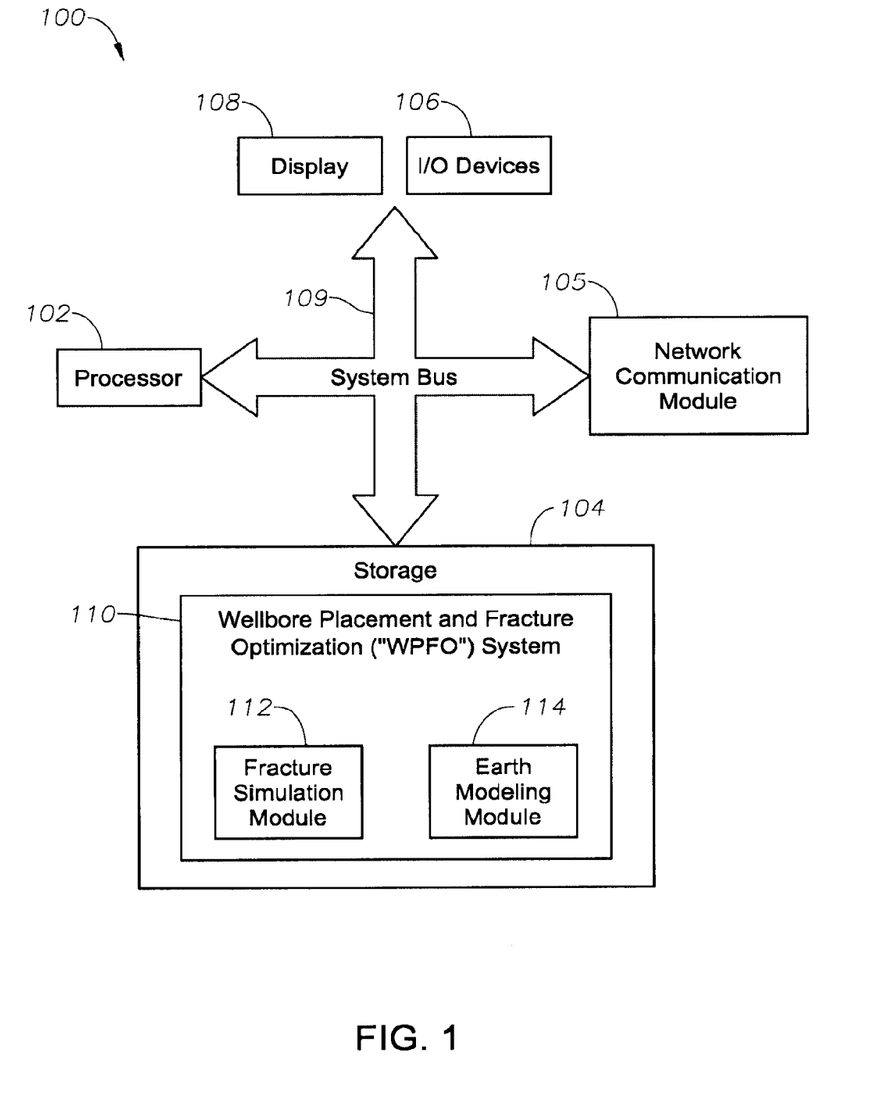
FIG. 1 illustrates a block diagram of a well placement and fracture optimization system according to an exemplary embodiment of the present invention.

FIG. 1 shows a block diagram of wellbore placement and fracture optimization ("WPFO") system 100 according to an exemplary embodiment of the present invention. As will be described herein, WPFO system 100 provides a platform in which to determine optimal well trajectories, fracture initiation points and fracture treatment designs for a given wellbore. More specifically, exemplary embodiments of the present invention provide a design methodology which greatly increases understanding of fracture growth behavior as a function of the fracture initiation point along the vertical stratigraphic position of the reservoir. The stratigraphic position refers to the position with respect to the formation layering in the vertical plane. Since the mechanical properties, stresses and characteristics of the reservoir can vary significantly in this environment, the fracture growth behavior will change significantly dependent upon where the fracture initiation point lies within the stratigraphic column. In contrast, however, the reservoirs tend to be much more consistent in the horizontal direction, meaning that vertical slices of the formation will tend to have similar stratigraphic behavior along a horizontal well or a significant portion of a horizontal well.

Accordingly, through utilization of the present invention, optimal well placements are determined, as well as optimal fracture initiation points and fracture treatment designs along the stratigraphic layer. Such well placements could be horizontal, deviated, high angle or vertical depending upon the reservoir characteristics and the desired reservoir contact achieved through stimulation. Other benefits of the present invention include, for example, determination of well trajectories to optimize stimulation performance; optimization of fracture treatment designs (e.g., injection rates, fluid type and viscosity, proppant type or concentration, etc.) based upon the stratigraphic well location and the desired fracture properties including length, height and conductivity; avoidance of poorly producing wellbore sections due to low probability of achieving successful stimulation treatments; and identification of stratigraphic sequences requiring multiple wellbores to effectively drain due to conditions that prevent complete fracture coverage.

Referring to FIG. 1, WPFO system 100 includes at least one processor 102, a non-transitory, computer-readable storage 104, transceiver/network communication module 105, optional I/O devices 106, and an optional display 108 (e.g., user interface), all interconnected via a system bus 109. Software instructions executable by the processor 102 for implementing software instructions stored within WPFO application 110 in accordance with the exemplary embodiments described herein, may be stored in storage 104 or some other computer-readable medium.

Although not explicitly shown in FIG. 1, it will be recognized that WPFO system 100 may be connected to one or more public and/or private networks via one or more appropriate network connections. It will also be recognized that the software instructions comprising WPFO application 110 may also be loaded into storage 104 from a CD-ROM or other appropriate storage media via wired or wireless methods.

In certain exemplary embodiments, WPFO application 110 comprises fracture simulation module 112 and earth modeling module 114. WPFO application 110 utilizes fracture simulation module 112 to model a given fracture design. In this regard, fracture simulation module 112 provides full integration between actual well properties and the fracture design criteria such as, for example, pumping rates, fluid efficiencies, or treatment volumes. Accordingly, WPFO application 110 provides the ability to accurately model, optimize and execute fracture operations. Exemplary fracture simulation platforms include, for example, FracXpert™, StimPlan™, GOHFER™ or FracPro™. However, those ordinarily skilled in the art having the benefit of this disclosure realize a variety of other fracture simulators may also be utilized with the present invention.

Still referring to the exemplary embodiment of FIG. 1, WPFO application 110 also includes earth modeling module 114 which provides well planning features and subsurface stratigraphic visualization including, for example, geo science interpretation, petroleum system modeling, geochemical analysis, stratigraphic gridding, facies and petrophysical property modeling. In addition, earth modeling module 114 models well paths, as well as cross-sectional through the facies and porosity data. Exemplary earth modeling platforms include DecisionSpace®, which is commercially available through the Assignee of the present invention, Landmark Graphics Corporation of Houston, Tex. However, those ordinarily skilled in the art having the benefit of this disclosure realize a variety of other earth modeling platforms may also be utilized with the present invention.

Moreover, WPFO application 110 also includes multidomain workflow automation capabilities that may connect any variety of desired technical applications. As such, the output from one application, or module, may become the input for another, thus providing the capability to analyze how various changes impact the well placement and/or fracture design. Those ordinarily skilled in the art having the benefit of this disclosure realize there are a variety of workflow platforms which may be utilized for this purpose.

Referring to FIGS. 2A-2G, exemplary methodologies of the present invention will now be described. At step 202, WPFO application 110, via earth modeling module 114 models the desired subsurface strata 116 (FIG. 2B), which may be displayed on a user interface via display 108. As shown, subsurface strata 116 comprises a plurality of formation layers 118 reflecting vertical heterogeneity. Some formation layers 118 are relatively thick, while others are very thin, each having different physical properties and stress tolerances. However, as previously mentioned, those properties of formation layers 118 are much more consistent in the horizontal direction.

Figure 2A:
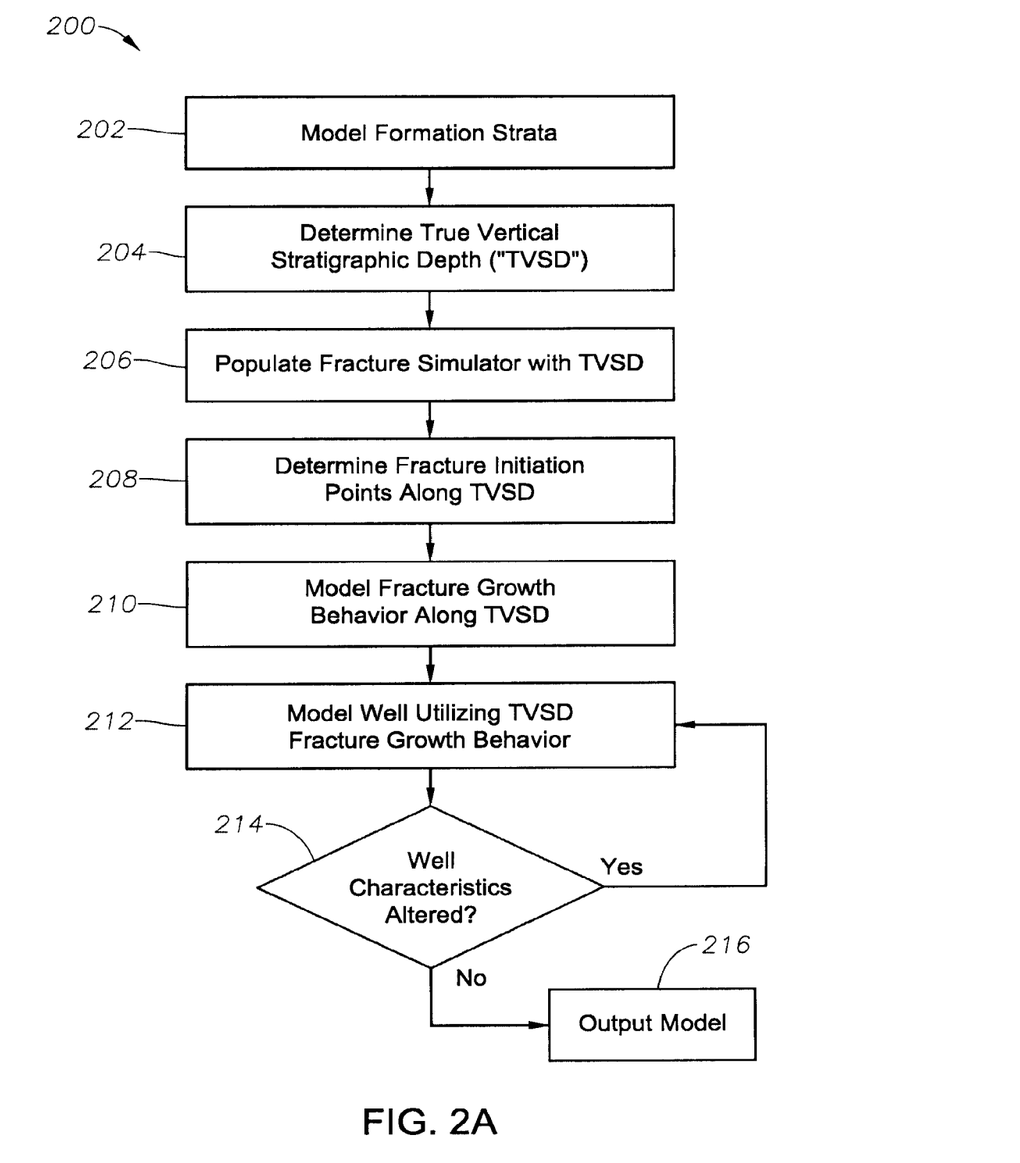
FIG. 2A illustrates a method for optimizing well placement and fracture optimization according to an exemplary methodology of the present invention.
Figure 2B:
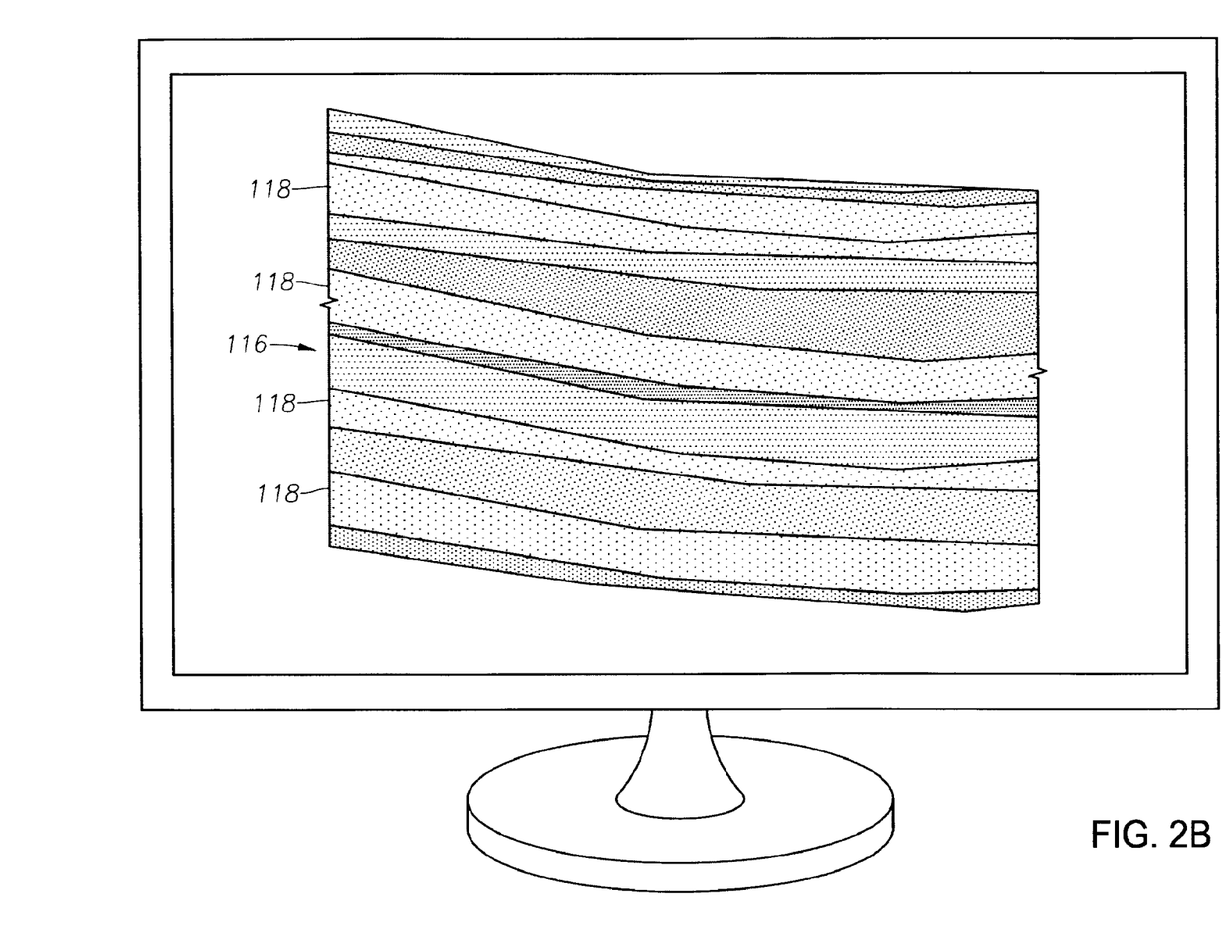
FIGS. 2B-2G illustrate various steps in a method for optimizing well placement and fracture optimization according to an exemplary methodology of the present invention.
Figure 2C:
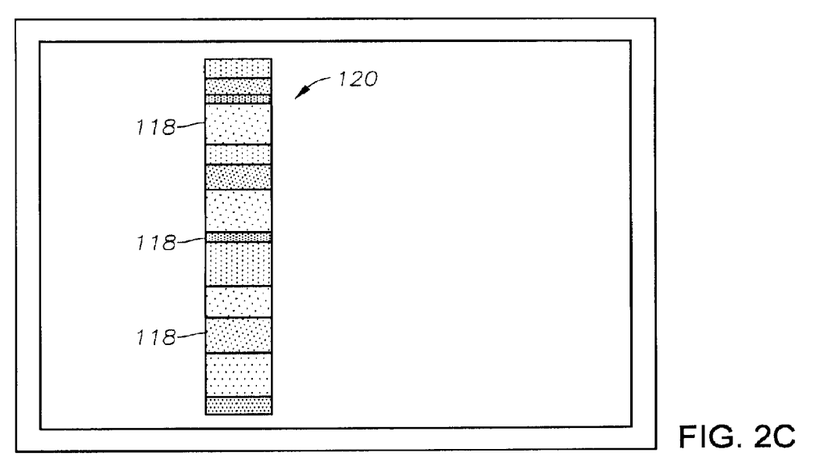

Thus, at step 204, WPFO application 110 extracts a representative snapshot of subsurface strata 116 along a vertical column that reflects a True Vertical Stratigraphic Depth ("TVSD") 120, as shown in FIG. 2C. Since formation layers 118 tend to be consistent over a long horizontal distance, WPFO application 110 essentially collapses subsurface strata 116 horizontally to create TVSD 120. As such, TVSD 120 comprises data representing properties of subsurface strata 116 along the vertical column such as, for example, effective porosity, effective permeability, natural fracture density, pore pressure, Young's Modulus, Poisson's Ratio, brittleness coefficient, maximum horizontal stress magnitude and direction, minimum horizontal stress magnitude and direction, rock strength, total organic content, reservoir fluid saturations, etc. Thus, through analysis of TVSD 120, WPFO application 110 applies the subsurface properties of the vertical column over the entire subsurface strata 116. Accordingly, through analysis of a single vertical column of subsurface strata 116, TVSD 120 embodies the physical characteristics of the entire length of the subsurface strata 116 along a horizontal or vertical wellbore.

Utilization of TSVD 120 is especially beneficial in that, without TVSD 120, wellbore placement and fracture optimization as described herein would require modeling of vertical slices for each proposed fracture stage along a horizontal wellbore. In some cases, each stage could include up to 4 perforated intervals, and a single well could have in excess of 30 stages leading to 120 fracture designs for analysis. Such an analysis would be very cost-prohibitive. However, the present invention reduces the analysis down to a single input file, using TVSD 120, and the other process features described herein for varying the initiation points so that optimized well placement and fracture designs can be established over an entire lateral length with minimal effort.

At step 206, WPFO application 110 populates fracture simulation module 112 with the data embodied within TVSD 120. Once fracture simulation module 112 has been populated with TVSD 120, the fracture growth behavior of the entire length of subsurface strata 116 can be evaluated for any number of imitation points within the vertical stratigraphic layering sequence. The fracture growth behavior includes, for example, the specific fracture geometries (e.g., gradient, length, height, width, conductivity, etc.) for each initiation point. Accordingly, at step 208, WPFO application 110 determines the fracture initiation points along TVSD 120. The fracture initiation points may be manually selected via a user interface (not shown), using display 108 & I/O devices 106, or may be determined by fracture simulation module 112 itself. For example, WPFO application 110 may select fracture initiation points for each formation layer 118 captured in earth modeling module 114. In an alternative embodiment, WPFO application 110 may select fracture initiation points at the interface of each formation layer 118, as well as in the center of each formation layer 118.

Moreover, the user interface may be interactive and provide the ability to click on portions of TVSD 120 in a 3D space, thus selecting the desired fracture initiation points. As understood in the art, the fracture behavior will change significantly depending upon where the fracture is initiated along the formation. Those ordinarily skilled in the art having the benefit of this disclosure realize that fracture simulation module 112, or similar platforms, have deterministic algorithms to select fracture initiation points, and such algorithms are envisioned within the present invention.

Figure 2D:
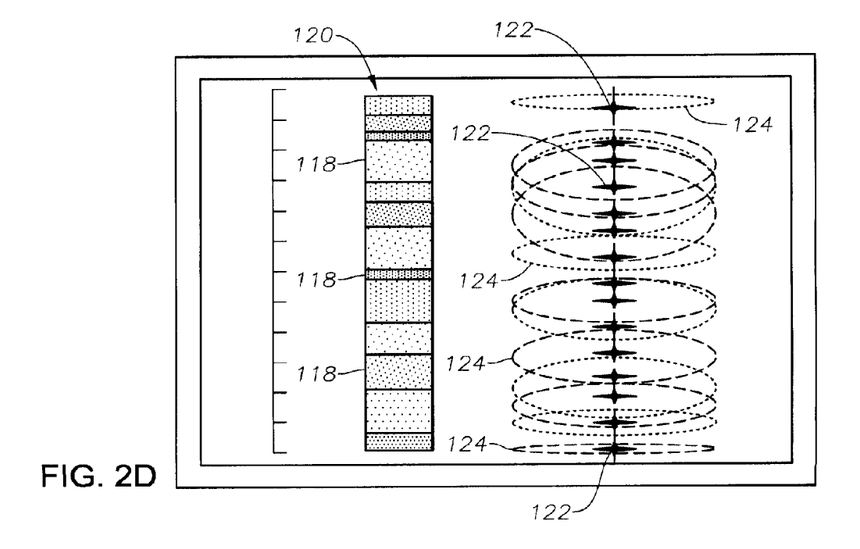

Nevertheless, referring to FIG. 2D, a plurality of fracture initiation points 122 have been selected along TVSD 120. At step 210, WPFO application 110, again using fracture simulation module 112, models the fracture growth behavior of initiation points 122 along TVSD 120. As shown in FIG. 2D, ellipses 124 represent the fracture growth behavior (e.g., fracture height, length or width) of each initiation point 122. However, in the alternative, a more complex representation of the fracture growth behavior as represented by fracture simulation module 112 may be utilized. Thus, having performed this analysis, WPFO application 110 now has modeled and analyzed the necessary data to "understand" the variable fracture behavior along subsurface strata 116. WPFO application 110 can now determine the behavior of various fracture treatment plans based upon a specified well path through any portion of subsurface strata 116. Accordingly, as will be further described below, certain exemplary embodiments of the present invention utilize the modeled fracture growth behavior as a geosteering tool to assist in optimal wellbore placement in order to maximize stimulation operations.

Figure 2E:
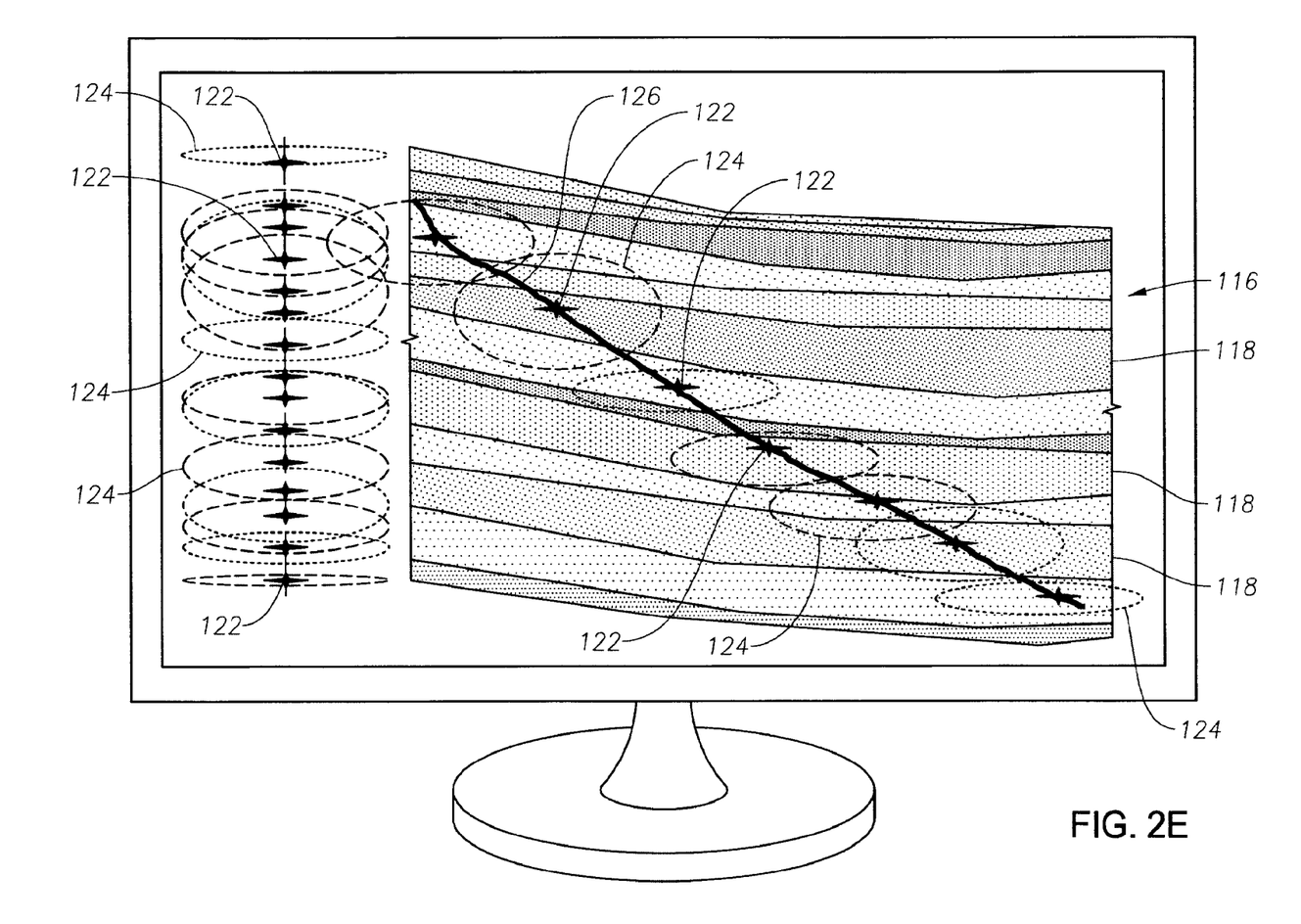

Still referring to the exemplary methodology shown in FIGS. 2A and 2E, at step 212, WPFO application 110 then models a wellbore 126 utilizing the data received from TVSD 120, the fracture growth behavior represented by ellipses 124, and fracture initiation points 122. In this exemplary embodiment, WPFO application 110 determines the optimal trajectory and fracture initiation points 122 for wellbore 126. However, in an alternative embodiment, selection of the optimum well path can be manually selected or computed by WPFO application 110 based upon specified results. Exemplary specified results include, for example, maximum number of proposed fracture stages, desired stimulated reservoir volume and desired reservoir contact achieved with the fracture designs.

Nevertheless, in this exemplary embodiment, wellbore 116 is a deviated well such as, for example, a horizontal or high angle well. However, those ordinarily skilled in the art having the benefit of this disclosure realize the present invention may also be applied to vertical wells. As shown in FIG. 2E, wellbore 126 has been modeled along the entirety of subsurface strata 116 such that fracture initiation points 122 and fracture growth ellipses 124 have been mapped onto wellbore 116. Although only a few fracture initiation points 122 and their respective fracture growth ellipses 124 have been mapped onto wellbore 116 for simplicity, note that certain exemplary embodiments may map more or less such points 122 and ellipses 124 as desired.

Still referring to FIG. 2E, it is further illustrated how modeling fracture growth behavior along TVSD 120 allows analysis of an infinite number of wellbores. As shown, fracture initiation points 122 and their respective growth ellipses 124, received from analyzing TVSD 120, have been mapped onto subsurface strata 116 along wellbore 126. Since the properties of formation layers 118 are homogeneous in the vertical direction, WPFO application 110 can now predict the behavior of any number of well trajectories and fracture designs.

Figure 2F:
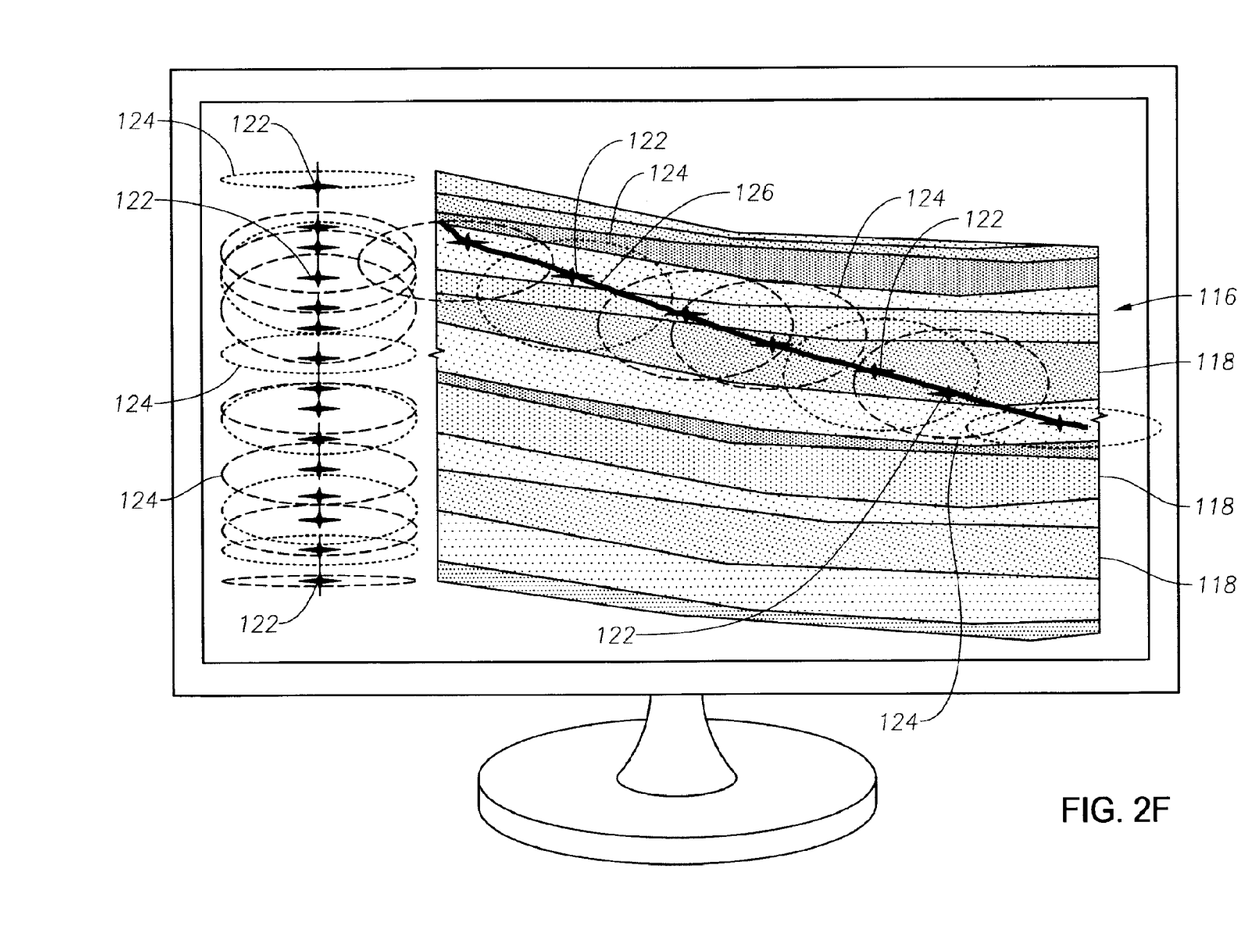
Figure 2G:
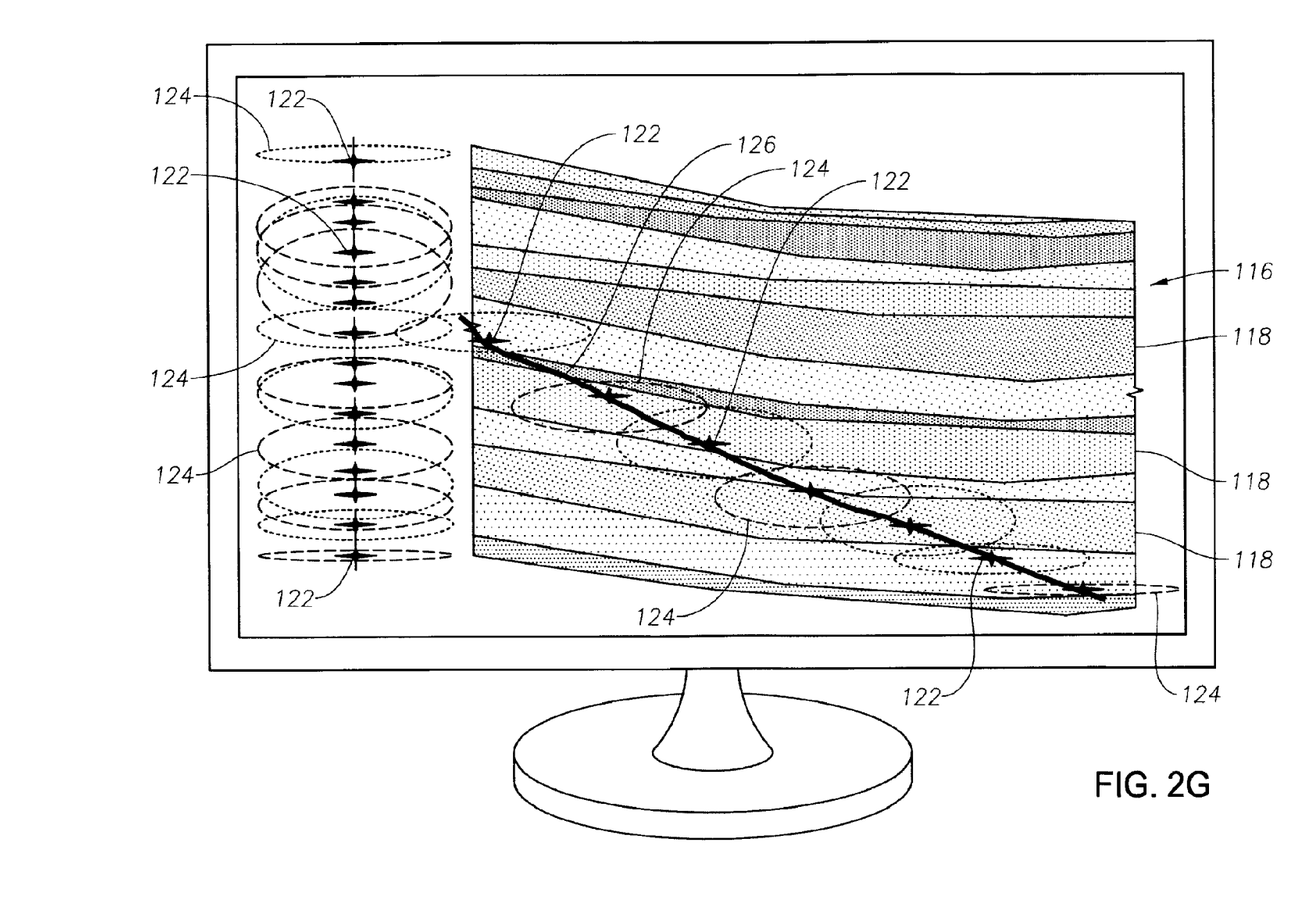

FIG. 2F illustrates an alternative exemplary trajectory for wellbore 126 in which WPFO application 110 has determined (at step 212) the optimal well path to cover only an upper portion of subsurface strata 116. FIG. 2G illustrates yet another exemplary path for wellbore 126 in which WPFO application 110 has determined the optimal well path to cover only a lower portion of subsurface strata 116

In an alternative exemplary embodiment of the present invention, after step 212, WPFO system 100 may also allow alteration of wellbore 126. For example, the well path of wellbore 126 may be altered using a click and drag functionality and/or fracture initiation points 122 may be deleted or added. In the alternative, real-time or other well data may be received by WPFO system 100 affecting the analysis. As such, at step 214, WPFO application 110 determines whether the characteristics of wellbore 126 have been altered. If the determination is "yes," WPFO application 110 re-models the altered wellbore 126 as previously described. If the determination is "no," WPFO application 110 will output the model at step 216 in a variety of forms such as, for example, a 3D interactive graphical display, chart or text report.

The exemplary embodiments and methodologies described herein may be utilized at a number of points along the wellbore design or operational processes. For example, the present invention may be utilized during the initial planning stage in order to determine where to position the wellbore and fracture initiation points. In another embodiment, however, the present invention may be utilized in real-time as the wellbore is being drilled in order to guide further operations. In yet another embodiment, the present invention may be used to determine optimal fracture initiation points along a wellbore that has been previously drilled. These and other aspects would be appreciated by those ordinarily skilled in the art having the benefit of this disclosure.

Figure 3:
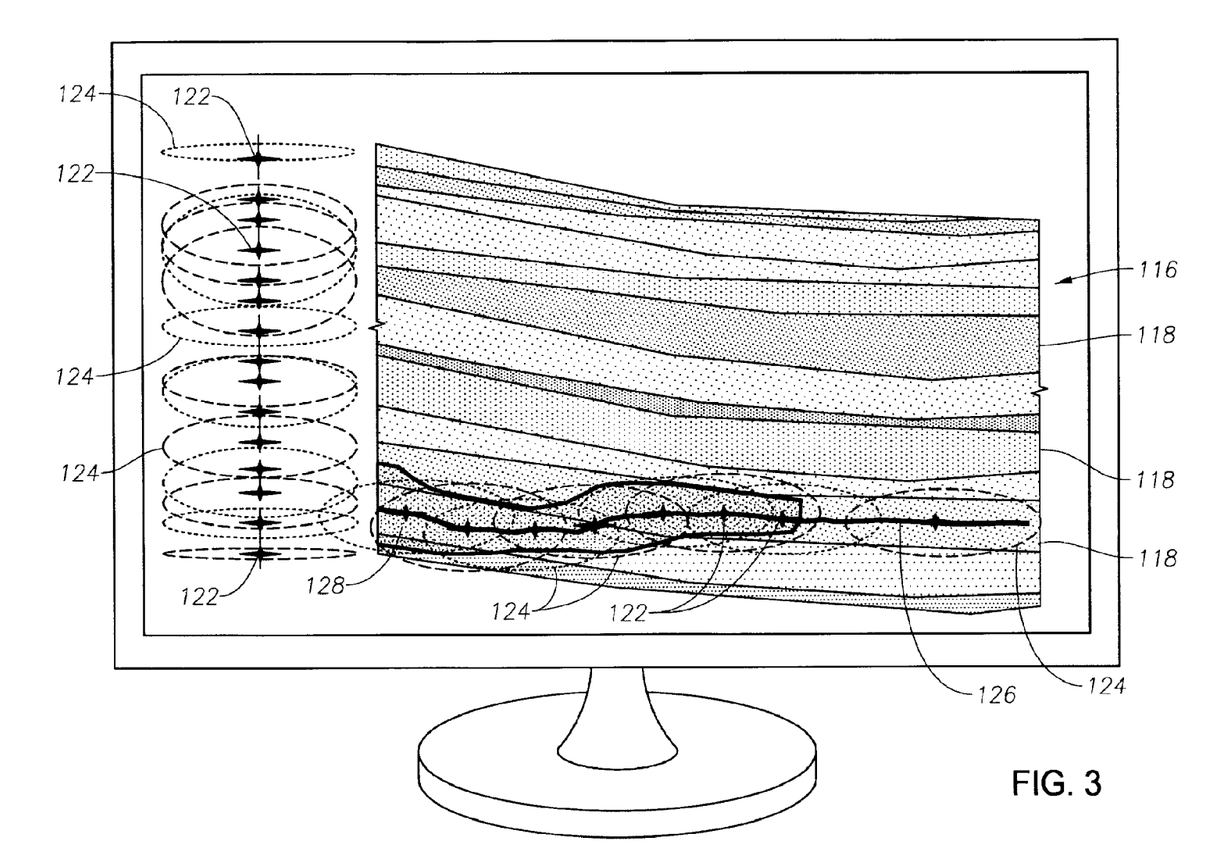
FIG. 3 illustrates a modeled wellbore having a trajectory and fracture stimulation design to optimize operations along a high quality reservoir section according to an exemplary embodiment of the present invention.

FIG. 3 illustrates an alternative exemplary embodiment of the present invention whereby well placement is optimized. As stated previously, since a given fracture will not always achieve sufficient height to contact the entire subsurface strata, well placement becomes a critical component of wellbore design. Accordingly, utilizing the present invention, well placement can be optimized so that fractures more effectively contact the better quality sections of subsurface strata 116.

FIG. 3 illustrates subsurface strata 116 modeled by WPFO application 110 at step 212. However, in this exemplary embodiment of step 212, WPFO application 110 also determines the location of a high quality reservoir section 128. As would be understood by those ordinarily skilled in the art having the benefit of this disclosure, such high quality reservoir sections may be determined by a grouping of 2 or 3 reservoir attributes in an unconventional asset. For example, combinations of the following may be utilized to identify layers that have the highest stimulation and production potential (i.e., high quality reservoir section 128): Young's Modulus, Poisson's Ratio, Brittleness Index, effective porosity, effective permeability, natural fracture density, stress anisotropy, and total organic content. Moreover, although illustrated as a single section, high quality reservoir section 128 may comprise a plurality of formation layers 118. Once the position of high quality reservoir section 128 has been determined, WPFO application 110 models wellbore 126 and fracture initiation points 122 accordingly, thereby determining the optimal well placement of wellbore 126 along high quality reservoir section 128.

In yet another exemplary embodiment of the present invention, WPFO application 110 extracts representative snapshots of subsurface strata 116 along 2 or more vertical columns in order to determine TVSD 120. In some instances, wellbore 126 may cross one or more faults. Therefore, WPFO application 110 would extract a corresponding number of vertical columns representing snapshots of subsurface strata 116 on each side of the fault, and then utilize this to model TVSD 120. Accordingly, exemplary embodiments of the present invention are also adapted to optimize well placement and fracturing design in reservoirs that exhibit significant heterogeneity in the lateral direction.

A number of addition features may be integrated within the present invention. For example, display 108 may render subsurface strata 116 as a 3D earth model, having color coded portions reflecting formation layers 118, high or low quality reservoir sections, etc. A depth scale may also be included to indicate the depth. In addition, earth modeling module 114 may capture all of the key parameters required to populate a reservoir simulator to predict production capability, as well as those parameters required to populate a fracture simulator module 112 in order to predict fracture dimensions. Exemplary key parameters include, for example, Young's Modulus, Poisson's Ratio, Brittleness Index, effective porosity, effective permeability, natural fracture density, stress anisotropy, and total organic content.

Moreover, in instances where the growth of a fracture initiation point 122 might extend outside a desired formation layer 118 or subsurface strata 116, exemplary embodiments of the present invention may generate an alert indicating a danger situation such as potential contamination of a water aquifer, a gas cap that could result in production of undesirable fluids or a low pressured zone that could result in cross flow or fluid communication reducing the production potential. Accordingly, those ordinarily skilled in the art having the benefit of this disclosure realize these and other features may be integrated into the present invention.

Accordingly, significant benefits are realized through utilization of the exemplary embodiments of the present invention. As described herein, a representative stratigraphic slice, or TVSD, is used to populate a fracture simulator, which can then be used to evaluate fracture growth behavior for a multitude of initiation points within a stratigraphic sequence. Through analysis of formation geology, geophysics, petrophysics and fracture initiation placement and geometry, fracture designs are optimized. Some of the treatment parameters which may be optimized for each fracture initiation point include, for example, injection rate, fluid type and fluid viscosity, treatment volume, proppant type, proppant concentration and proppant volume.

Moreover, through analysis of the fracture behavior growth and reservoir quality, exemplary embodiments of the present invention determine if there is an optimum fracture initiation point and where that point is within the stratigraphic sequence. Thus, more effective well planning is realized which results in the maximization of stimulation performance and production. Accordingly, the present invention provides the ability to design completions in a very complex environment where effective engineering has proven be very difficult and often ignored.

The foregoing methods and systems described herein are particularly useful in planning, altering and/or drilling wellbores. As described, the system utilizes a representation of the TVSD of the subsurface strata to conduct a fracture simulation of the entire length of the strata, thus determining the optimal wellbore placement and fracture stimulation plan. Accordingly, based on the determined wellbore placement and/or fracture stimulation plan, a wellbore is planned, deviated in real-time and/or further operations are altered. Thereafter, well equipment is identified and prepared based upon the well placement or stimulation plan, and the wellbore is drilled, stimulated, altered and/or completed in accordance to the well placement or stimulation plan.

Those of ordinary skill in the art will appreciate that, while exemplary embodiments and methodologies of the present invention have been described statically as part of implementation of a well placement or stimulation plan, the methods may also be implemented dynamically. Thus, a well placement or stimulation plan may be modeled and the data utilized as a geosteering tool to update the well plan for the drilling of wellbores. After implementing the well placement or stimulation plan, the system of the invention may be utilized during the completion process on the fly or iteratively to determine optimal well trajectories, fracture initiation points and/or stimulation design as wellbore parameters change or are clarified or adjusted. In either case, the results of the dynamic calculations may be utilized to alter a previously implemented well placement or stimulation plan.

Accordingly, an exemplary methodology of the present invention provides a computer-implemented method to determine a wellbore design, the method comprising modeling subsurface strata of a geological formation, analyzing a vertical column of the subsurface strata in order to determine a true vertical stratigraphic depth ("TVSD") of the subsurface strata, modeling fracture growth behavior for one or more fracture initiation points along the TVSD and determining the wellbore design based upon the modeled fracture growth behavior for the one or more fracture initiation points along the TVSD. In another exemplary methodology, determining the wellbore design further comprises determining the wellbore design for a horizontal or high angle wellbore. In yet another, modeling fracture growth behavior further comprises determining a position of the one or more fracture initiation points along the TVSD. In another, determining the wellbore design further comprises determining at least one of a wellbore trajectory or fracture stimulation design.

In yet another exemplary methodology, determining the wellbore design further comprises determining at least one of a location of one or more fracture initiation points along the wellbore, fracture injection rates, fracture fluid types or proppant types. In another, the methodology further comprises determining a location of a high quality reservoir section within the subsurface strata and determining optimal placement of the wellbore along the high quality reservoir section. In yet another, modeling the fracture growth behavior of the one or more fracture initiation points further comprises modeling at least one of a fracture length, fracture height, fracture weight, or proppant conductivity of the one or more fracture initiation points. In another, determining the wellbore design further comprises detecting an alteration of the wellbore design and re-modeling the wellbore design based upon the alteration. Yet another methodology further comprises generating an alert indicating a danger situation associated with the wellbore design. In yet another, the well design is utilized to drill or stimulate the wellbore.

An exemplary embodiment of the present invention provides a system comprising processing circuitry to determine a wellbore design, the processing circuitry performing the method comprising modeling subsurface strata of a geological formation, analyzing a vertical column of the subsurface strata in order to determine a true vertical stratigraphic depth ("TVSD") of the subsurface strata, modeling fracture growth behavior for one or more fracture initiation points along the TVSD, and determining the wellbore design based upon the modeled fracture growth behavior for the one or more fracture initiation points along the TVSD. In another, determining the wellbore design further comprises determining the wellbore design for a horizontal or high angle wellbore. In yet another, modeling fracture growth behavior further comprises determining a position of the one or more fracture initiation points along the TVSD. In another, determining the wellbore design further comprises determining at least one of a wellbore trajectory or fracture stimulation design.

In yet another exemplary embodiment, determining the wellbore design further comprises determining at least one of a location of one or more fracture initiation points along the wellbore, fracture injection rates, fracture fluid types or proppant types. Another further comprises determining a location of a high quality reservoir section within the subsurface strata and determining optimal placement of the wellbore along the high quality reservoir section. In yet another, modeling the fracture growth behavior of the one or more fracture initiation points further comprises modeling at least one of a fracture length, fracture height, fracture weight, or proppant conductivity of the one or more fracture initiation points. In another, determining the wellbore design further comprises detecting an alteration of the wellbore design and re-modeling the wellbore design based upon the alteration. Yet another further comprises generating an alert indicating a danger situation associated with the wellbore design. In another, the well design is utilized to drill or stimulate the wellbore.

Yet another exemplary embodiment of the present invention provides a system to determine a well design, the system comprising a processor and a memory operably connected to the processor, the memory comprising software instructions stored thereon that, when executed by the processor, causes the processor to perform a method comprising modeling subsurface strata of a geological formation, analyzing a vertical column of the subsurface strata in order to determine a true vertical stratigraphic depth ("TVSD") of the subsurface strata, modeling fracture growth behavior for one or more fracture initiation points along the TVSD, and determining the wellbore design based upon the modeled fracture growth behavior for the one or more fracture initiation points along the TVSD.

In addition to the foregoing, a computer program product embodying instructions to execute the steps described herein are also envisioned. Accordingly, exemplary embodiments of the present invention provide a computer program product comprising instructions to determine a well design, the instructions which, when executed by at least one processor, causes the processor to perform a method comprising modeling subsurface strata of a geological formation, analyzing a vertical column of the subsurface strata in order to determine a true vertical stratigraphic depth ("TVSD") of the subsurface strata, modeling fracture growth behavior for one or more fracture initiation points along the TVSD, and determining the wellbore design based upon the modeled fracture growth behavior for the one or more fracture initiation points along the TVSD. In another exemplary embodiment, modeling fracture growth behavior further comprises determining a position of the one or more fracture initiation points along the TVSD. In another, determining the wellbore design further comprises determining at least one of a wellbore trajectory or fracture stimulation design. In yet another, determining the wellbore design further comprises determining at least one of a location of one or more fracture initiation points along the wellbore, fracture injection rates, fracture fluid types or proppant types.

Yet another exemplary embodiment further comprises determining a location of a high quality reservoir section within the subsurface strata and determining optimal placement of the wellbore along the high quality reservoir section. In another, modeling the fracture growth behavior of the one or more fracture initiation points further comprises modeling at least one of a fracture length, fracture height, fracture weight, or proppant conductivity of the one or more fracture initiation points. In yet another, determining the wellbore design further comprises detecting an alteration of the wellbore design and re-modeling the wellbore design based upon the alteration. In yet another, determining the wellbore design further comprises determining the wellbore design for a horizontal or high angle wellbore. In yet another, the well design is utilized to drill or stimulate the wellbore.

Although various embodiments and methodologies have been shown and described, the invention is not limited to such embodiments and methodologies and will be understood to include all modifications and variations as would be apparent to one skilled in the art. Therefore, it should be understood that the invention is not intended to be limited to the particular forms disclosed. Rather, the intention is to cover all modifications, equivalents and alternatives falling within the spirit and scope of the invention as defined by the appended claims.

What is claimed is:

1. A computer-implemented method of optimizing well design and placement, the method comprising:
    modeling, by a computer system, subsurface strata of a geological formation;
    extracting, by the computer system, a representative snapshot of the subsurface strata along a vertical column, based on the modeling;
    analyzing, by the computer system, the representative snapshot of the subsurface strata in order to determine subsurface properties along a true vertical stratigraphic depth ("TVSD") of the subsurface strata;
    modeling fracture growth behavior for one or more fracture initiation points along the TVSD of the subsurface strata, based on the analysis;
    determining, by the computer system, a wellbore design including an optimal path of a wellbore to be drilled within the subsurface strata, based upon the modeled fracture growth behavior for the one or more fracture initiation points along the TVSD; and
    drilling the wellbore along the optimal path with the subsurface strata in accordance with the wellbore design.

2. A computer-implemented method as defined in claim 1, wherein the wellbore is a horizontal or high angle wellbore.

3. A computer-implemented method as defined in claim 1, wherein modeling fracture growth behavior further comprises determining a position of the one or more fracture initiation points along the TVSD.

4. A computer-implemented method as defined in claim 1, wherein determining the wellbore design further comprises determining a fracture stimulation design.

5. A computer-implemented method as defined in claim 4, wherein determining the fracture stimulation design further comprises:
    mapping the one or more fracture initiation points from the TVSD onto corresponding locations along the wellbore within the subsurface strata; and
    determining at least one of fracture injection rates, fracture fluid types, or proppant types.

6. A computer-implemented method as defined in claim 4, further comprising: performing stimulation operations along the wellbore, based on the fracture stimulation design.

7. A computer-implemented method as defined in claim 1, wherein determining the wellbore design further comprises:
    determining a location of a high quality reservoir section within the subsurface strata; and
    determining optimal placement of the wellbore along the high quality reservoir section.

8. A computer-implemented method as defined in claim 1, wherein modeling the fracture growth behavior of the one or more fracture initiation points further comprises modeling at least one of a fracture length, fracture height, fracture weight, or proppant conductivity of the one or more fracture initiation points.

9. A computer-implemented method as defined in claim 1, further comprising:
    detecting an alteration of the wellbore design as the wellbore is drilled along the optimal path within the subsurface strata; and responsive to the detection, updating the wellbore design based upon the alteration.

10. A computer-implemented method as defined in claim 1, further comprising generating an alert indicating a danger situation associated with the wellbore design.

11. A system comprising:
a processor; and
a memory coupled to the processor, the memory storing instructions, which, when executed by the processor, cause the processor to:
model subsurface strata of a geological formation;
extract a representative snapshot of the subsurface strata along a vertical column;
analyze the representative snapshot of the subsurface strata in order to determine subsurface properties along a true vertical stratigraphic depth ("TVSD") of the subsurface strata;
model fracture growth behavior for one or more fracture initiation points along the TVSD of the subsurface strata, based on the analysis; and
determine a wellbore design including an optimal path of a wellbore to be drilled within the subsurface strata, based upon the modeled fracture growth behavior for the one or more fracture initiation points along the TVSD, wherein the wellbore is drilled along the optimal path within the subsurface strata in accordance with the wellbore design.

12. A system as defined in claim 11, wherein the wellbore is a horizontal or high angle wellbore.

13. A system as defined in claim 11, wherein the instructions, when executed by the processor, further cause the processor to determine a position of the one or more fracture initiation points along the TVSD.

14. A system as defined in claim 11, wherein the instructions, when executed by the processor, further cause the processor to determine a fracture stimulation design.

15. A system as defined in claim 14, wherein the instructions, when executed by the processor, further cause processor to:
map the one or more fracture initiation points from the TVSD onto corresponding locations along the wellbore within the subsurface strata; and
determine at least one of fracture injection rates, fracture fluid types, or proppant types.

16. A system as defined in claim 14, wherein the fracture stimulation design is utilized to perform stimulation operations along the wellbore.

17. A system as defined in claim 11, wherein the instructions, when executed by the processor, further cause the processor to:
determine a location of a high quality reservoir section within the subsurface strata; and
determine optimal placement of the wellbore along the high quality reservoir section.

18. A system as defined in claim 11, wherein the instructions, when executed by the processor, further cause the processor to model at least one of a fracture length, fracture height, fracture weight, or proppant conductivity of the one or more fracture initiation points.

19. A system as defined in claim 11, wherein the instructions, when executed by the processor, further cause the processor to:
detect an alteration of the wellbore design as the wellbore is drilled along the optimal path within the subsurface strata; and
responsive to the detection, update the wellbore design based upon the alteration.

20. A system as defined in claim 11, wherein the instructions, when executed by the processor, further cause the processor to generate an alert indicating a danger situation associated with the wellbore design.

21. A non-transitory computer-readable medium comprising instructions, which, when executed by at least one processor, cause the processor to:
model subsurface strata of a geological formation;
extract a representative snapshot of the subsurface strata along a vertical column;
analyze the representative snapshot of the subsurface strata in order to determine subsurface properties along a true vertical stratigraphic depth ("TVSD") of the subsurface strata;
model fracture growth behavior for one or more fracture initiation points along the TVSD of the subsurface strata, based on the analysis; and
determine a wellbore design including an optimal path of a wellbore to be drilled within the subsurface strata, based upon the modeled fracture growth behavior for the one or more fracture initiation points along the TVSD, wherein the wellbore is drilled along the optimal path within the subsurface strata in accordance with the wellbore design.

22. A non-transitory computer-readable medium as defined in claim 21, wherein the instructions, when executed by the processor, further cause the processor to determine a position of the one or more fracture initiation points along the TVSD.

23. A non-transitory computer-readable medium as defined in claim 21, wherein the instructions, when executed by the processor, further cause the processor to determine a fracture stimulation design.

24. A non-transitory computer-readable medium as defined in claim 23, wherein the instructions, when executed by the processor, further cause the processor to:
map the one or more fracture initiation points from the TVSD onto corresponding locations along the wellbore within the subsurface strata; and
determine at least one of fracture injection rates, fracture fluid types, or proppant types.

25. A non-transitory computer-readable medium as defined in claim 23, wherein the fracture stimulation design is utilized to perform stimulation operations along the wellbore.

26. A non-transitory computer-readable medium as defined in claim 21, wherein the instructions, when executed by the processor, further cause the processor to:
determine a location of a high quality reservoir section within the subsurface strata; and
determine optimal placement of the wellbore along the high quality reservoir section.

27. A non-transitory computer-readable medium as defined in claim 21, wherein the instructions, when executed by the processor, further cause the processor to model at least one of a fracture length, fracture height, fracture weight, or proppant conductivity of the one or more fracture initiation points.

28. A non-transitory computer-readable medium as defined in claim 21, wherein the instructions, when executed by the processor, further cause the processor to model:
detect an alteration of the wellbore design as the wellbore is drilled along the optimal path within the subsurface strata; and
responsive to the detection, update the wellbore design based upon the alteration.

29. A non-transitory computer-readable medium as defined in claim 21, wherein the wellbore is a horizontal or high angle wellbore.

30. A system to determine a well design, the system comprising:
- a processor; and
- a memory operably connected to the processor, the memory comprising software instructions stored thereon that, when executed by the processor, causes the processor to perform a method comprising:

modeling subsurface strata of a geological formation;

extracting a representative snapshot of the subsurface strata along a vertical column, based on the modeling;

analyzing the representative snapshot of the subsurface strata in order to determine subsurface properties along a true vertical stratigraphic depth ("TVSD") of the subsurface strata;

modeling fracture growth behavior for one or more fracture initiation points along the TVSD of the subsurface strata, based on the analysis; and determining a wellbore design including an optimal path of a wellbore to be drilled within the subsurface strata, based upon the modeled fracture growth behavior for the one or more fracture initiation points along the TVSD, wherein the wellbore is drilled along the optimal path within the subsurface strata in accordance with the wellbore design.

* * * * *

UNITED STATES PATENT AND TRADEMARK OFFICE
CERTIFICATE OF CORRECTION

PATENT NO. : 10,060,226 B2
APPLICATION NO. : 14/426231
DATED : August 28, 2018
INVENTOR(S) : Ronald Glen Dusterhoft and Marty Paulk It is certified that error appears in the above-identified patent and that said Letters Patent is hereby corrected as shown below:

In the Specification

Column 7, Line 41 change "proven be" to -- proven to be --

In the Claims

Column 10, Line 28 change "with" to -- within --

Column 11, Line 38 change "cause" to -- cause the --

Signed and Sealed this
Twenty-sixth Day of February, 2019

Andrei Iancu
*Director of the United States Patent and Trademark Office*